(12) United States Patent
Boscolo

(10) Patent No.: US 7,265,592 B2
(45) Date of Patent: Sep. 4, 2007

(54) DIGITAL SWITCHING APPARATUS FOR DRIVING A LOAD

(75) Inventor: Michele Boscolo, Chioggia (IT)

(73) Assignee: STMicroelectronics S.r.l., Agrate Brianza (MI) (IT)

( * ) Notice: Subject to any disclaimer, the term of this patent is extended or adjusted under 35 U.S.C. 154(b) by 50 days.

(21) Appl. No.: 11/238,411

(22) Filed: Sep. 29, 2005

(65) Prior Publication Data
US 2006/0066365 A1 Mar. 30, 2006

(30) Foreign Application Priority Data
Sep. 30, 2004 (IT) .......................... MI2004A1864

(51) Int. Cl.
*H03B 1/00* (2006.01)
(52) U.S. Cl. ...................... 327/109; 327/551
(58) Field of Classification Search ........ 327/109–112, 327/551
See application file for complete search history.

(56) References Cited

U.S. PATENT DOCUMENTS 5,055,708 A * 10/1991 Sugawara .................. 327/110
5,933,453 A * 8/1999 Lewison ..................... 375/238
5,952,738 A * 9/1999 Miller ........................ 307/116
6,653,960 B2* 11/2003 Mitamura et al. .......... 341/143
6,784,648 B2* 8/2004 Mitamura et al. .......... 323/282

* cited by examiner

*Primary Examiner*—Quan Tra
*Assistant Examiner*—Hai L. Nguyen
(74) *Attorney, Agent, or Firm*—Lisa K. Jorgenson; Jon A. Gibbons; Fleit Kain Gibbons Gutman Bongini & Bianco P.L.

(57) ABSTRACT

The present invention refers to a digital apparatus suitable for driving a load. The apparatus an input for receiving a voltage signal varied by an external disturbance and comprises means for sampling at least the external disturbance such as noise, and a driving circuit such as a pulse width modulator for driving the load with a suitable output voltage. The apparatus includes a control circuit suitable for generating digital commands representative of a desired output voltage of the apparatus. The apparatus also comprises digital correction circuit suitable for generating a correction signal on the basis of the difference between the value of the current sample and the value of the previous sample of at least the external disturbance. The output of the driving circuit is governed by the correction signal.

13 Claims, 3 Drawing Sheets

DIGITAL SWITCHING APPARATUS FOR DRIVING A LOAD

CROSS-REFERENCE TO RELATED APPLICATIONS

This application is based upon and claims priority from prior Italian Patent Application No. MI2004A001864, filed on Sep. 30, 2004 the entire disclosure of which is herein incorporated by reference.

FIELD OF THE INVENTION

The present invention refers to a digital switching apparatus for driving a load, more particularly an inductive load.

BACKGROUND OF THE INVENTION

In electronic systems in which one wants to increase the rejection to an external disturbance of the output signal an additional circuitry is generally used based on feed-forward techniques. The techniques act in such a manner to prevent the variation of the output value due to an external disturbance; the disturbance is measured and the corrective action is undertaken before the disturbance has spread to the output signal thereby increasing the immunity of the output signal to the external disturbance.

Electronic systems in which the feed-forward techniques are used are, for example, the control systems of the voice coil motor (VCM) of a hard disk based on a power stage whose output voltage is a function of the supply voltage, or also a driving system of a spindle motor of a hard disk.

A system type in which the output signal is a function of the supply voltage is the Pulse Width Modulation (PWM) driving system. In a PWM driving system the power stage only works in saturation state (that is towards the supply voltage or towards a reference voltage) and cut-off state. The percentage of the period of time in which the power stage supplies in output the voltage for supplying the load in relation to the total period of time of excitation is called duty-cycle. In a PWM driving system in which a compensation of the variations of the supply voltage does not exist the output signal is proportional to the input signal and to the noise.

Devices for compensating the variations of the supply voltage in driving systems have been used; in the digital driving systems the devices generally comprise the use of an analog-digital converter (ADC), sampled at a certain frequency, for reading the entity of the disturbance.

To keep the voltage constant at the terminals of the load in presence of disturbances or variations of the supply voltage various techniques are used that tend to make the product of the supply voltage for the duty-cycle independent from the variations. For this reason the duty-cycle is varied in function of the value of the supply voltage.

A method for keeping the voltage on the load constant in presence of variations of the supply voltage is described in the U.S. Pat. No. 6,735,038. The method comprises the driving of a VCM by means of a suitable device coupled with a supply voltage, the generation of commands indicating a voltage desired in output from the device, the comparison of the supply voltage with a reference voltage for generating an error signal, the modification of the commands in function of the error signal and the supplying of the modified commands to the device for generating an output voltage on the basis of the modified commands.

SUMMARY OF THE INVENTION

The present invention provides a digital switching apparatus for driving a load that is more immune from the disturbances than the prior art.

In accordance with the present invention, a digital apparatus suitable for driving a load is disclosed. The apparatus has as an input a voltage signal varied by an external disturbance. The apparatus comprises a means for further sampling at least the external disturbance, means for driving the load suitable for generating an output voltage for driving the load and control means suitable for generating digital commands representing a desired output voltage of the apparatus, characterised in that it comprises digital correction means suitable for generating a correction signal on the basis of the difference between the value of the current sample and the value of the previous sample of at least the external disturbance. The control means is suitable for generating digital commands modified on the basis of the correction signal, and the driving means generates the output voltage on the basis of the modified commands.

Thanks to the present invention it is possible to produce a digital switching apparatus for driving a load that reduces considerably the effects of the disturbance on the driving current of the load and permits the use of lower sampling frequencies than those of known apparatus.

BRIEF DESCRIPTION OF THE DRAWINGS

The characteristics and advantages of the present invention will appear evident from the following detailed description of embodiments thereof, illustrated as non-limiting example in the enclosed drawings, in which.

DETAILED DESCRIPTION

Figure 1:
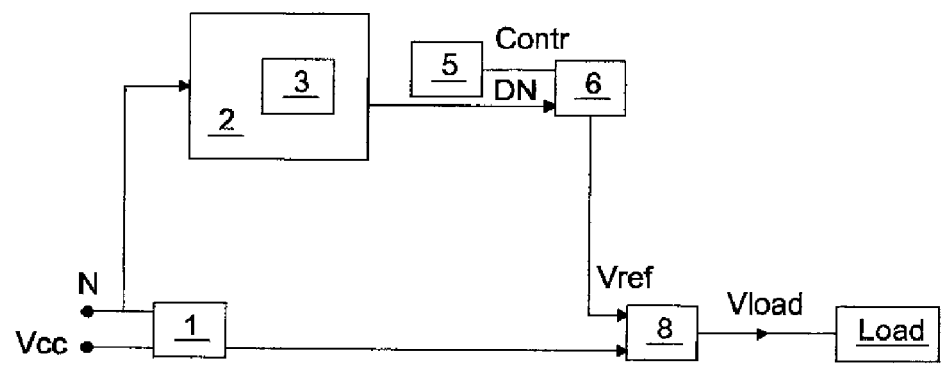
FIG. 1 is a diagram of an apparatus for driving an inductive load according to the known art.

With reference to FIG. 1 an apparatus for driving an inductive load LOAD according to the prior art is shown. The apparatus has a supply voltage Vcc and a noise N in input, that is the undesired disturbance that produces the modulation of the supply voltage Vcc; the modulation is schematised by a block 1 that produces a signal Vcc×N in input to the apparatus. An analog-to-digital (A/D) converter 2 digitally converts the value of the noise N and calculates the inverse of the value emitting a signal DN; the converter 2 works with a sampling frequency set by an internal block 3. A control device 5 generates a control signal Contr for the inductive load; the control signal is sent to a gain circuit block 6 that multiplies it for the signal DN so as to generate the signal Vref that has to guarantee the independence of the output voltage Vload from the noise N during the sampling instants. The signal Vref is in input to a circuit block 8 that comprises a PWM generator and a switching power stage. The converter circuit block 8 receives in input the signals Vref and Vcc×N and produces the signal Vload for driving the load LOAD. The signal Vout is proportional to the product of the signals Vcc×N and Vref and as Vref is given by Contr×DN the signal Vload is proportional only to the signal Contr during the sampling instants.

Figure 2:
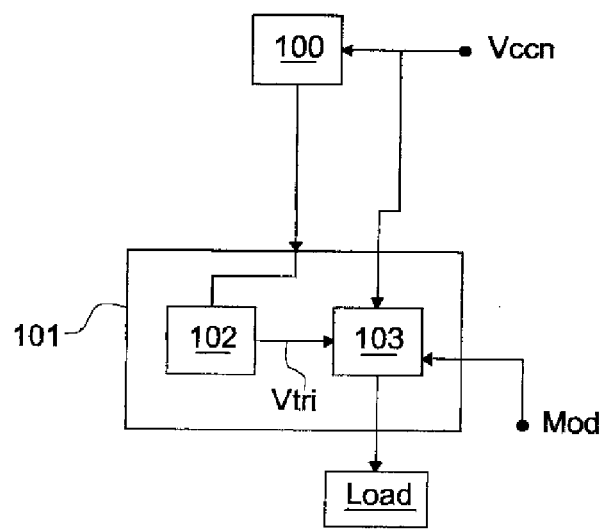
FIG. 2 is a diagram of another apparatus for driving an inductive load according to the known art.

FIG. 2 shows another apparatus for driving an inductive load load according to the prior art. The apparatus comprises an analog-to-digital (A/D) converter 100 suitable for digitally converting the voltage signal Vccn that is the supply voltage Vcc varied by the disturbance N. The signal digital in output to the converter 100 is sent to a PWM or converter 101. The latter comprises a digital counter or converter 102 suitable for producing a digital signal Vtri that has a maximum value equal to the digital signal received by the block 100. The converter PWM also comprises a digital comparator 103 that receives in input a modulating signal Mod, the signal Vtri coming from the counter 102 and the supply voltage Vccn; the digital comparator is structured so as to produce a PWM signal based on the comparison between the signal in output from the counter 102 and the modulating signal Mod.

Figure 3:
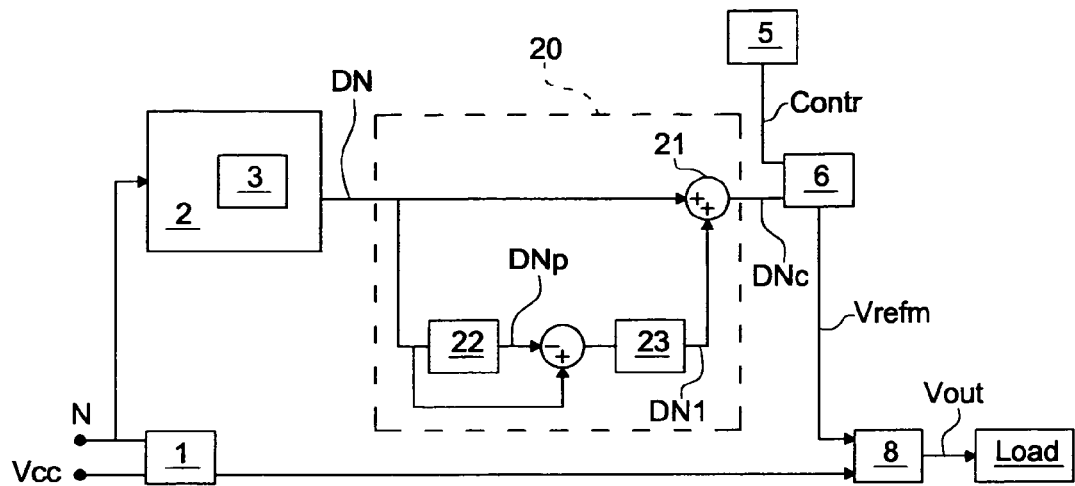
FIG. 3 is a diagram of an apparatus for driving a load according to a first embodiment of the present invention.

FIG. 3 shows a diagram of an apparatus for driving a load, preferably an inductive load, according to a first embodiment of the present invention; the elements that are the same as the apparatus of FIG. 1 will be indicated with the same numerical references. The apparatus includes an input for receiving a supply voltage Vcc and a noise that is the undesired disturbance that produces the modulation of the supply voltage Vcc. The modulation is schematised by a block 1 that produces a signal Vcc×N in response to an input to the apparatus. An analog-to-digital (A/D) converter 2 digitally converts the value of the noise N and calculates the inverse of the value, emitting a correction signal DN. The converter 2 works with a sampling frequency set by an internal block 3. The correction signal DN is an input to a correction circuit 20.

The correction circuit 20, which works with a sampling frequency set by the block 3, is suitable for generating a further correction signal DN1 on the basis of a difference between a value of a current sample and a value of a previous sample of the signal DN. The signal DN1 is sent to an adder node 21 so that a signal DNc, which is a sum of the signals DN and DN1, is sent to the control device 5. The correction circuit block 20 has the signal DN as an input and supplies a signal DNp, which is the previous sample, by means of a delay circuit block 22. The difference between the signals DN and DNp forms the signal DNc that is sent to the control device 5. Preferably the correction circuit block 20 comprises a gain block 23 suitable for modulating the signal DNc and the same correction circuit block 20 can be considered a digital shunt.

The control device 5 generates a control signal Contr for the inductive load. The control signal is sent to the gain circuit block 6 that multiplies it by the signal DNc so as to generate the signal Vrefm that has to guarantee the almost complete independence of the output voltage Vout from the noise N at all instants of time. The signal Vrefm is an input to a modulator circuit block 8 that comprises a PWM generator and a switching power stage. The circuit block 8 receives input the signals Vrefm and Vcc×N and produces the signal Vout for driving the load LOAD. The signal Vout is proportional to the product of the signals Vcc×N and Vrefm. Because Vrefm is given by Contr×DNc, the signal Vout is proportional to the signal Contr×DNc×N, where the average of the factor DNc×N tends to 1.

Figure 4:
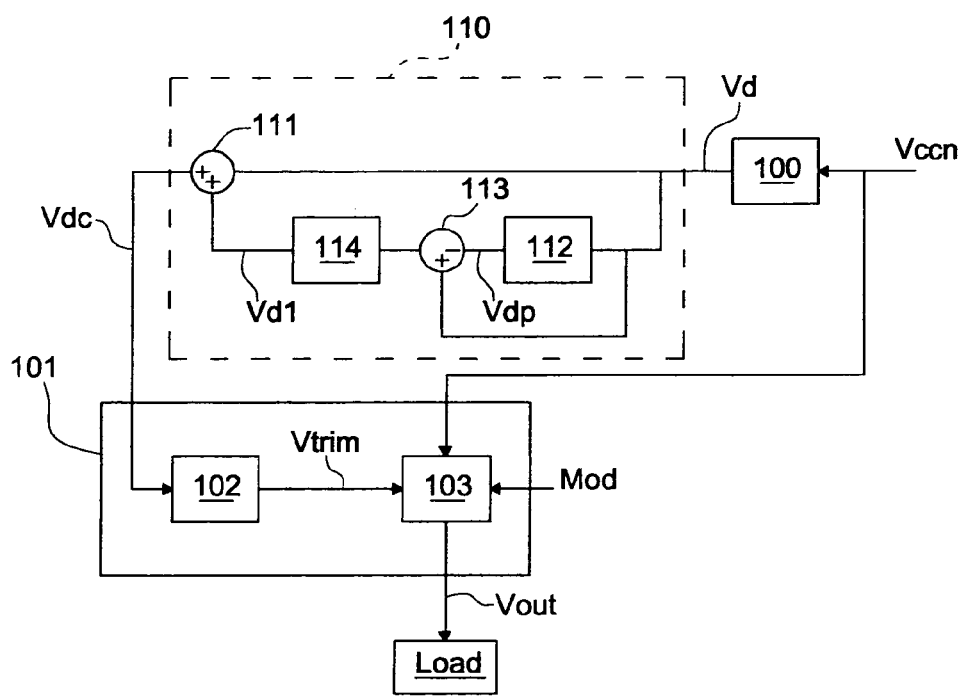
FIG. 4 is a diagram of an apparatus for driving a load according to a second embodiment of the present invention.

FIG. 4 shows an apparatus according to the second embodiment of the present invention; the elements that are the same as the apparatus of FIG. 2 will be indicated with the same numerical references. The apparatus comprises an analog-to-digital converter 100 suitable for digitally converting the supply voltage Vccn that is the supply voltage Vcc varied by a noise signal N. The signal digital Vd in output to the converter 100 is sent to a digital correction circuit block 110, which is entirely similar to the correction circuit block 20 of the apparatus of FIG. 3. The correction circuit block 110 comprises a delay circuit block 112 with a feed forward adder node 113 that supplies a signal Vdp that is the previous sample of the signal Vd. The difference Vd1 between the current sample Vd and the previous sample Vdp is sent preferably to a gain circuit block 114 and the signal in output is added to the signal Vd by means of an adder node 111 producing a signal Vdc that is sent to the converter PWM 101. The latter comprises a digital converter 102 suitable for producing a digital signal Vtrim whose maximum value is equal to the digital signal received from the correction circuit block 110. The PWM converter also comprises a digital comparator 103 that receives in input a modulating signal Mod, the signal Vtrim coming from the counter 102 and the supply voltage Vcc; the digital comparator is structured to produce a signal PWM based on the comparison between the signal in output from the counter 102 and the modulating signal Mod. The signal Vout in output from the block 103 drives the load LOAD.

Figure 5:
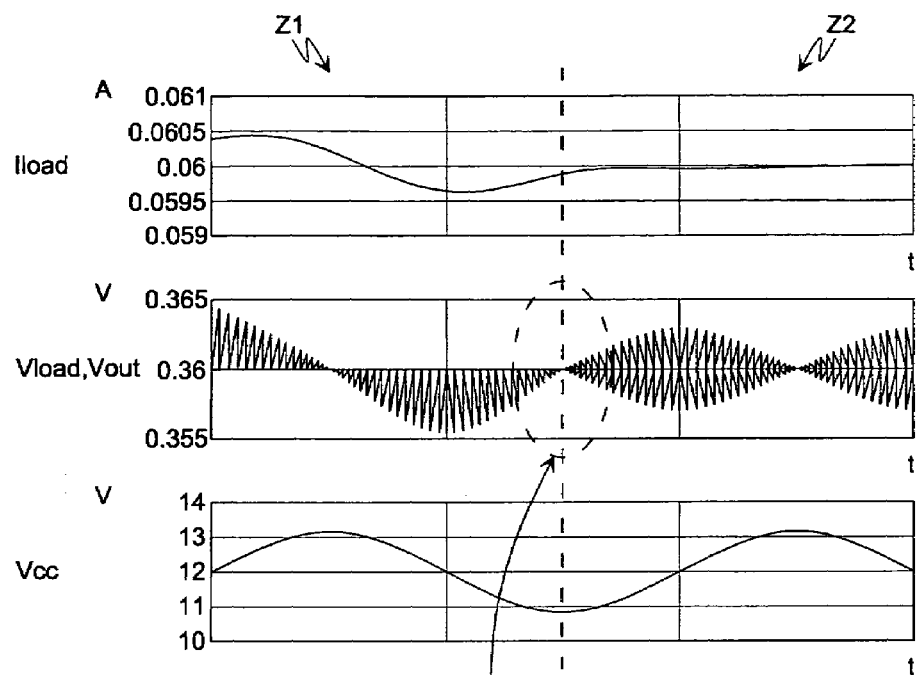
FIG. 5 is a graph of the voltage on the load, of the current on the load and of the supply voltage for the apparatus of FIG. 1 and the apparatus of FIG. 3.
Figure 6:
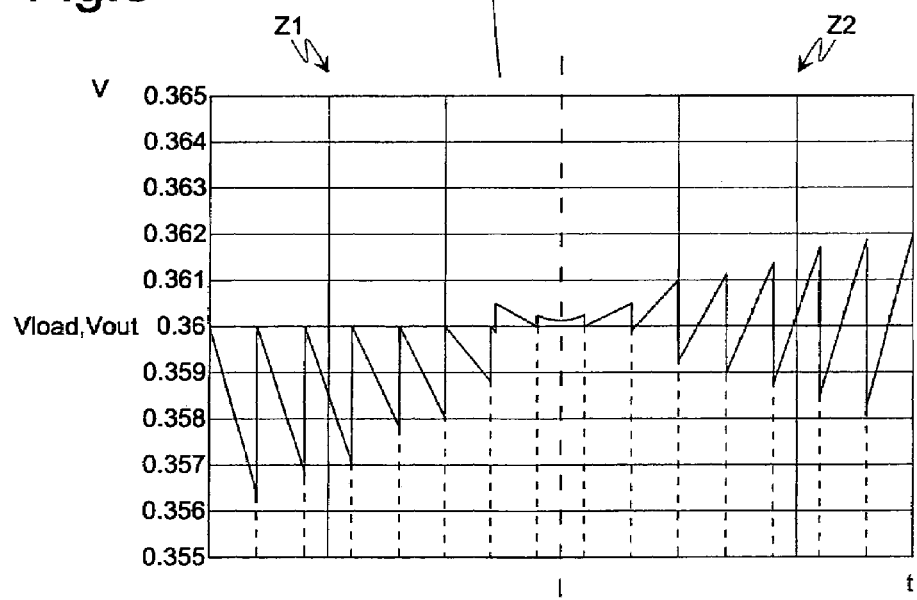
FIG. 6 shows in more detail an area of the zone of the graph of the voltage on the load of FIG. 5.

FIG. 5 shows a graph of the voltage on the load Vload, Vout, of the current on the load Iload and of the supply voltage Vcc for the apparatus of FIG. 1 (zone Z1 of the graph) and the apparatus of FIG. 3 (zone Z2 of the graph). It can be noted from the graph that the current Iload is more immune from the variations of the supply voltage for the apparatus of FIG. 3 compared to the apparatus of FIG. 1. The voltage Vload for the apparatus of FIG. 1 is corrected only in the sampling instants and this generates an error in the average value of the voltage Vload. The voltage Vout of the apparatus of FIG. 3 is corrected in the sampling instants so as to generate a symmetrical variation compared to the value of the voltage Vout desired guaranteeing a more accurate compensation, as can be seen better in FIG. 6 that shows in more detail a zone of the graph of FIG. 5.

The invention claimed is:

1. An apparatus suitable for driving a load, the apparatus comprising:
    an input for receiving a voltage signal modulated by a noise signal;
    a sampling circuit for sampling at least the noise signal and for outputting a sample of the at least the noise signal;
    a modulator circuit for generating a modulated output voltage to drive the load; and
    a correction circuit for generating correction signals representative of a desired output voltage, the correction circuit including
        a delay circuit for delaying the sample of the noise signal and for outputting a previous sample of the noise signal, and
        a combining circuit, coupled to the delay circuit, for combining the previous sample of the noise signal and a current sample of the noise signal, and for outputting correction signals,
    wherein the correction signals are proportional to a difference between a value of the current sample of the noise signal and a value of the previous sample of the noise signal, and wherein the modulated output voltage produced by the modulator circuit is governed by the correction signals.

2. The apparatus according to claim 1, wherein the voltage signal is a supply voltage signal.

3. The apparatus according to claim 1, wherein the sampling circuit includes an analog-to-digital converter.

4. The apparatus according to claim 1, wherein the previous sample of the noise signal is formed by passing the current sample of the noise signal through a delay circuit.

5. The apparatus according to claim 1, further comprising:
 a control device for producing a control signal, wherein the correction signals are combined with the control signal for governing the modulator circuit.

6. The apparatus according to claim 1, in which the load is an inductive load coupled to modulator for receiving the modulated output voltage therefrom.

7. The apparatus according to claim 1, wherein the modulator further comprising:
 a converter for producing a trimming signal from the correction signal; and
 a comparator that generates the modulated output voltage in response to a comparison between the trimming signal and the voltage signal.

8. The apparatus according to claim 1, wherein the modulated output voltage is corrected in sampling instants so as to generate a symmetrical variation compared to the value of the desired output voltage.

9. The apparatus according to claim 1, wherein said correction circuit further comprises:
 an adder for adding the current sample of the noise signal to the difference between the value of the current sample the noise signal and the value of the previous sample of the noise signal.

10. The apparatus according to claim 9, wherein said current sample of the noise signal represents an inverse of the noise signal.

11. The apparatus according to claim 1, further comprising:
 a gain circuit for amplifying the correction signal.

12. The apparatus according to claim 11, wherein the sampling circuit samples the voltage signal modulated by the noise signal.

13. The apparatus according to claim 12, wherein the sampling circuit includes an analog-to-digital converter.

* * * * *